US010757836B2

(12) United States Patent
Lemacks et al.

(10) Patent No.: US 10,757,836 B2
(45) Date of Patent: Aug. 25, 2020

(54) SOLAR/HEAT SHIELD FOR PEDESTAL HOUSINGS USED WITH ACTIVE ELECTRONIC DEVICES AND/OR HEAT SENSITIVE COMPONENTS

(71) Applicant: CHANNELL COMMERCIAL CORPORATION, Temecula, CA (US)

(72) Inventors: Michael A. Lemacks, Temecula, CA (US); Timothy S. Safranek, Heath, TX (US); Edward J. Burke, Temecula, CA (US)

(73) Assignee: CHANNELL COMMERCIAL CORPORATION, Temecula, CA (US)

( * ) Notice: Subject to any disclaimer, the term of this patent is extended or adjusted under 35 U.S.C. 154(b) by 0 days.

(21) Appl. No.: 16/191,046

(22) Filed: Nov. 14, 2018

(65) Prior Publication Data

US 2019/0174655 A1    Jun. 6, 2019

Related U.S. Application Data

(60) Provisional application No. 62/594,384, filed on Dec. 4, 2017.

(51) Int. Cl.
*H05K 7/20* (2006.01)
*H05K 5/02* (2006.01)
*H05K 5/03* (2006.01)
*H05K 9/00* (2006.01)

(52) U.S. Cl.
CPC ....... *H05K 7/20427* (2013.01); *H05K 5/0213* (2013.01); *H05K 5/03* (2013.01); *H05K 7/20127* (2013.01); *H05K 7/20418* (2013.01); *H05K 9/003* (2013.01); *H05K 9/0009* (2013.01); *H05K 9/0032* (2013.01); *H05K 9/0045* (2013.01); *H05K 9/0084* (2013.01); *H05K 9/0086* (2013.01)

(58) Field of Classification Search
CPC ........... H05K 7/20409; H05K 7/20418; H05K 7/20427; H05K 5/0213; H05K 9/0032; H05K 9/0047; H05K 9/0045; H05K 9/003; H05K 9/0009; H05K 9/0084; H05K 9/0086; G01R 29/0821
See application file for complete search history.

(56) References Cited

U.S. PATENT DOCUMENTS

| | | | | |
|---|---|---|---|---|
| 4,726,193 A | * | 2/1988 | Burke | F25B 21/02 62/354 |
| 5,164,542 A | * | 11/1992 | Hart | G06F 1/1626 174/383 |
| 5,557,064 A | * | 9/1996 | Isem-Flecha | H05K 3/284 174/378 |

(Continued)

*Primary Examiner* — Paresh H Paghadal
(74) *Attorney, Agent, or Firm* — Lewis Roca Rothgerber Christie LLP (57) ABSTRACT

A pedestal housing for heat reduction generated by electronic components within the pedestal housing having a cover in which the electronic components are located, a cap positioned on an upper surface of the cover for forming an attic above the cover, a support layer and an insulation layer positioned between the cover and the cap in the attic and a heat and solar barrier layer positioned within the attic for electromagnetic radiation reflection away from the electronic components and electromagnetic radiation absorption from a radiation source and the electronic components.

17 Claims, 6 Drawing Sheets

(56) References Cited

U.S. PATENT DOCUMENTS

| | | | | |
|---|---|---|---|---|
| 6,501,015 B2* | 12/2002 | Maloney | | H02G 3/0493 |
| | | | | 174/17 VA |
| 7,129,422 B2* | 10/2006 | Arnold | | H05K 9/0024 |
| | | | | 174/377 |
| 7,488,901 B2* | 2/2009 | Arnold | | H05K 9/0024 |
| | | | | 174/377 |
| 9,846,459 B2* | 12/2017 | Lewis | | H05K 9/0024 |
| 10,297,998 B2* | 5/2019 | Tsuchida | | H01F 27/36 |
| 2001/0046822 A1* | 11/2001 | Yoshikawa | | B29C 45/1418 |
| | | | | 442/58 |
| 2003/0134078 A1* | 7/2003 | Urata | | B32B 1/04 |
| | | | | 428/69 |
| 2005/0028999 A1* | 2/2005 | Leu | | H05K 9/0083 |
| | | | | 174/386 |
| 2006/0272875 A1* | 12/2006 | Matsuda | | B62J 27/00 |
| | | | | 180/197 |
| 2007/0139904 A1* | 6/2007 | English | | H05K 9/0032 |
| | | | | 361/818 |
| 2007/0171600 A1* | 7/2007 | Pedoeem | | H04L 12/18 |
| | | | | 361/600 |
| 2009/0146862 A1* | 6/2009 | Malone | | H05K 9/0045 |
| | | | | 342/1 |
| 2009/0283319 A1* | 11/2009 | Hsieh | | H05K 7/20509 |
| | | | | 174/350 |
| 2010/0128433 A1* | 5/2010 | Harwood | | H05K 7/20545 |
| | | | | 361/690 |
| 2011/0183599 A1* | 7/2011 | German | | H01M 10/6563 |
| | | | | 454/343 |
| 2013/0155350 A1* | 6/2013 | Choi | | G02F 1/13452 |
| | | | | 349/61 |
| 2014/0196380 A1* | 7/2014 | Burke | | G02B 6/4451 |
| | | | | 52/20 |
| 2014/0198456 A1* | 7/2014 | Bose | | H05K 7/2049 |
| | | | | 361/720 |
| 2016/0113162 A1* | 4/2016 | Lin | | H05K 9/0088 |
| | | | | 428/40.7 |
| 2017/0054277 A1* | 2/2017 | Unger | | H02B 1/50 |
| 2017/0120760 A1* | 5/2017 | Kume | | B60L 3/0015 |

* cited by examiner

SOLAR/HEAT SHIELD FOR PEDESTAL HOUSINGS USED WITH ACTIVE ELECTRONIC DEVICES AND/OR HEAT SENSITIVE COMPONENTS

CROSS-REFERENCE TO RELATED APPLICATION(S)

This application claims priority to and the benefit of U.S. Provisional Application No. 62/594,384 filed Dec. 4, 2017 the contents of which are incorporated herein by reference.

BACKGROUND

Pedestal housings used in "outside plant" infrastructure for communications and utility companies often house active electronic components which generate heat. The temperature inside the housing increases above ambient conditions due to the heat generated from the active components as well as direct and indirect solar exposure and radiant heat from other objects around the housing. The increase in the internal temperature of the housing transfers heat to the electronic components with adverse consequences. These components tend to fail at shorter and shorter intervals with increases in temperature or operate at reduced rates. As communications companies increase data rates to customers, more active electronics are placed in the outside infrastructure and the higher data rates typically require active components that generate more heat and are more prone to temperature induced failures. There have been many attempts to mitigate the heat build up with venting and fans to help remove heated air from inside the housing with various degrees of success. However the drive to more powerful electronics has created a need for better solutions to the total heating problem.

Prior solutions utilized an additional plastic part over the top of the pedestal known as an attic to improve the looks and strength of larger pedestals. It had the additional effect of adding a layer of plastic and airspace, with venting, to the top of the pedestal. In the early days of cable taps and amplifiers this helped with heat load but as power levels increased and electronic components became more sensitive to temperature increases, a layer of fiberglass insulation was added to reduce heat transfer from the attic to the inside of the housing. Over the last several years the industry reached a point where those measures were no longer effective by themselves. The next phase involved much greater venting in the sides of the pedestal as well as large vent holes in the top of the pedestal but underneath the attic for weather protection. Additionally, the holes under the attic were designed to allow for direct attachment of cooling fans in extreme conditions. However, the use of fans introduced its own set of problems as they had to be powered, which increased the power transmission requirements to the pedestal and they introduced electronic noise into the system. They were also prone to failure, which necessitated replacement and additional maintenance costs. These changes reduced the heat build up inside the housing but were still inadequate and the use of fans was not an acceptable long term solution.

SUMMARY OF THE INVENTION

The present invention is a pedestal housing for active electronic components which generate heat which consists of a cover, an optional insulation support, an insulation layer and a cap. The cover includes a plurality of vents positioned around the sides of the cover and has a top surface upon which is positioned the insulation support, insulation and the cap. If incorporated, the insulation support supports the insulation layer adjacent to and inside surface of the cap. A barrier layer which is a heat and solar shield is positioned on the insulation support or co-molded with the insulation support. In embodiments where there is no insulation support the barrier layer can be attached to the insulation layer. The barrier layer is positioned between the insulation layer and the cap. The incorporation of a cap and an insulation support above the cover creates an attic for the pedestal in which the insulation and barrier layer is located.

The pedestal housing of the present invention provides heat reduction by reducing the solar and radiant heat load on the pedestal. This is accomplished by one or more related methods singularly or combined which include electromagnetic radiation, especially infrared (IR), reflection away from protected components within the pedestal housing; electromagnetic radiation, especially infrared (IR), absorption between the source and the components being shielded; enhanced insulation to reduce heat transfer rates to the protected components; use of the attic as an integral component of a heat/solar shield; and use of a heat/solar shield between the attic and the cover of the pedestal housing. The attic is designed to allow natural convection from the pedestal housing and allow for the use of fans. The attic may also incorporate features to assist in airflow of natural or forced convection such as airflow direction to side vents, and may also be used to hold additional insulation material in place.

Advantages of the present invention include using an attic to reduce solar heat transfer as well as radiant heat from nearby objects such as rocks, buildings or masonry walls; use of integrated fan attachment points for forced convective cooling in non-metallic pedestal covers; improved insulation in the attic to reduce heat transfer from the attic surface exposed to the sun by improved "R" values; using thinner insulation higher in the attic to reduce heat transfer while retaining room for venting the top of the pedestal housing under the attic and allow for fan use if required; raising the attic further above the top of the cover of the pedestal housing to allow for better heat escape from the pedestal housing; use of an inner layer of heat reflective material as a solar shield between the attic and the pedestal housing to reflect electromagnetic radiation, primarily infrared radiation (IR), from entering the pedestal housing where the heat sensitive components are contained, the solar shield follows the contours of the top of the attic preserving natural convective flow from the pedestal housing and still allows for the use of fans in extreme circumstances; use of an inner layer of heat reflective material as a solar shield under the pedestal housing cap to reflect electromagnetic radiation, primarily infrared radiation (IR), from entering the pedestal housing where the heat sensitive components are contained; utilizing an attic made from materials which have a greater resistance to heat transfer such as foamed plastics; providing an attic made from heat reflective material to reflect electromagnetic radiation, primarily infrared radiation (IR), from entering the pedestal housing where the heat sensitive components are contained which preserves the natural convective flow from the pedestal housing and still allows for the use of fans in extreme circumstances; providing an attic made from composite materials that may have an outer layer for appearance, UV stability and weatherability and inner layers of heat reflecting and/or insulation properties; and providing a pedestal housing made from heat reflective material to reflect electromagnetic radiation, primarily infrared radiation (IR), from entering the pedestal housing where the heat sensitive components are contained. As used in this application "insulation" shall mean an infrared/thermal reflector, barrier/insulation and "insulation support" shall mean an infrared/thermal reflector, barrier, insulation and support.

DETAILED DESCRIPTION OF THE DRAWINGS

Figure 1:
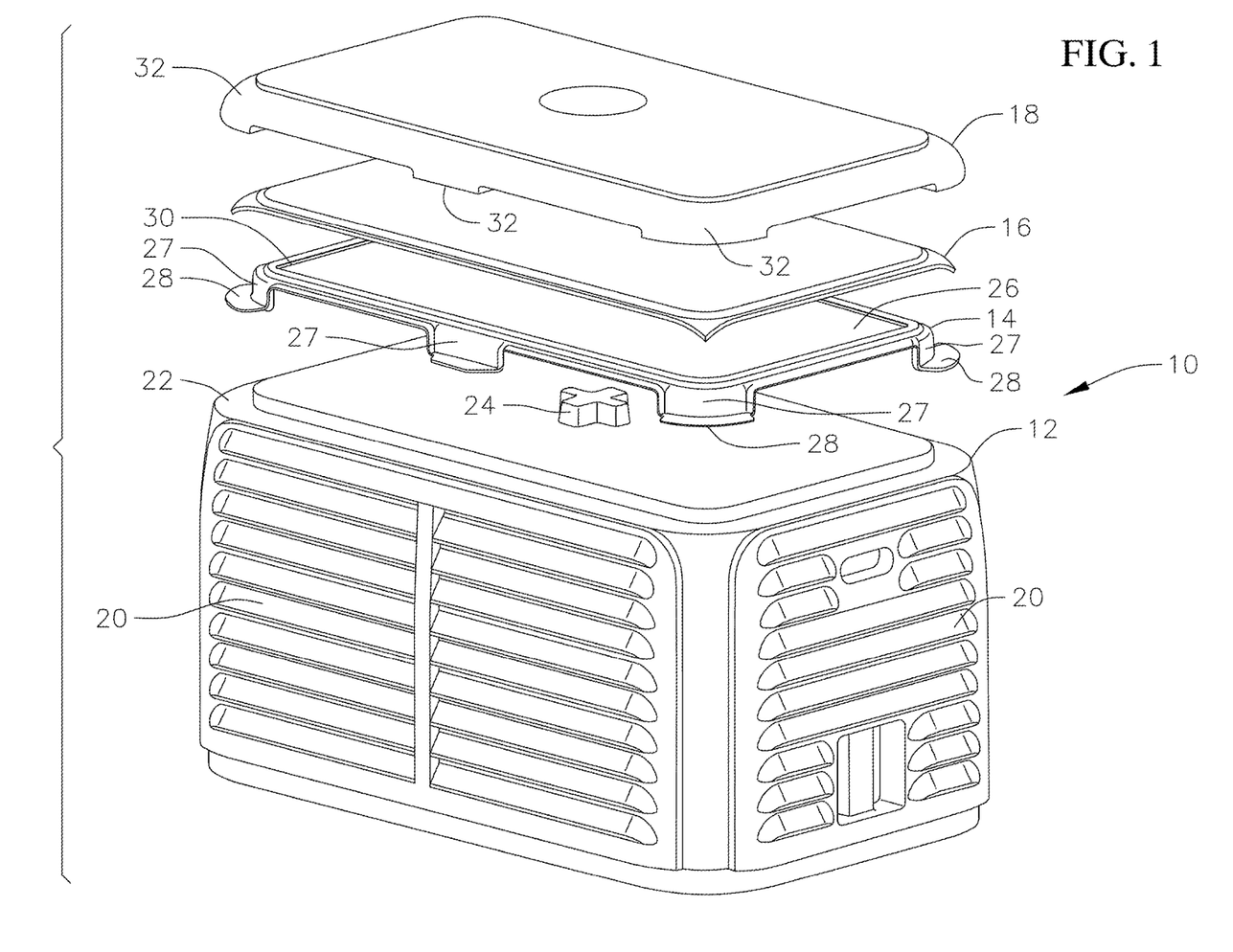
FIG. 1 is an exploded perspective view of a pedestal housing of the present invention.
Figure 2:
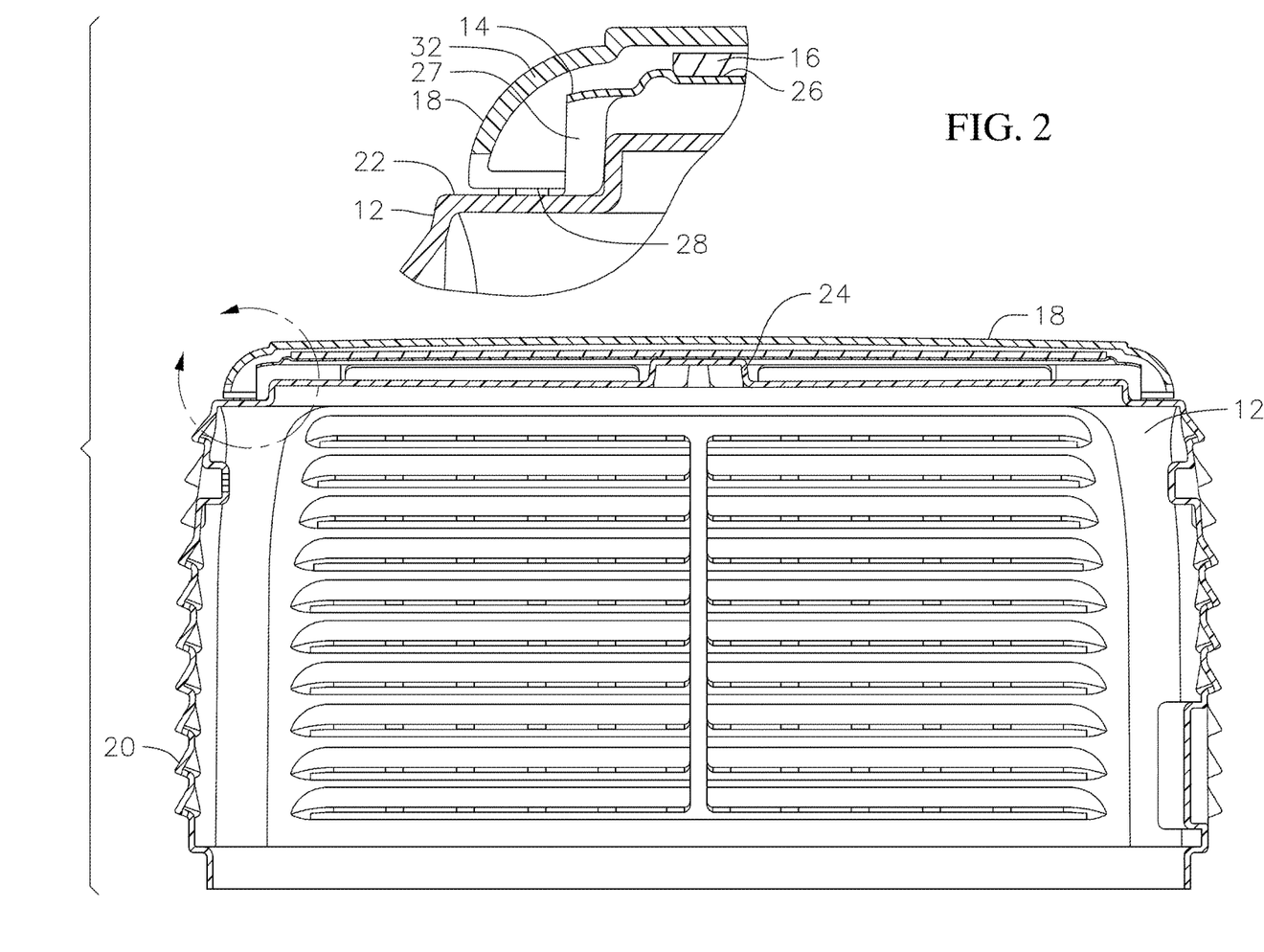
FIG. 2 is a cross-sectional view of the pedestal housing of FIG. 1.

FIG. 1 is perspective exploded view of a pedestal housing 10 of the present invention. The housing consists of a cover 12, an insulation support 14, an insulation layer 16 and a cap 18. The cover includes a plurality of vents 20 positioned around the sides of the cover and has a top portion 22 upon which is positioned the insulation support 14, insulation 16 and cap 18. As also shown in FIG. 2, the top portion 22 includes a raised portion 24 to provide support for the upper components. The insulation support 14 can sit upon the raised portion 24 and supports the insulation layer 16 under the inside surface of the cap 18. The insulation support 14 includes a barrier layer 26. The barrier layer can be made out of transition metals such as silver, chrome, aluminum, nickel or gold film. Materials other than transition metals that exhibit IR reflective properties can also be used, for example inorganic material such as metal oxides and sulfides which can be compounded with the plastic used for the pedestal, the cap and/or the insulation support; or organic material as a coating on the insulation support. The barrier layer is a heat/solar shield. The insulation layer 16 can be fiberglass or other commercially available insulation materials. A typical size of the pedestal housing is 24 inches wide by 42 inches in length, however, other sizes such as 24 inches by 36 inches are also utilized depending upon the particular application.

The insulation support has a plurality of legs 27 positioned around the perimeter of the support which project downwardly and terminate in a pad 28. The pad rests on the top portion 22 of the cover 12 so that the insulation support is raised above the top portion 22 thereby creating or increasing an airgap between the cover 12 and the components which form the attic. The barrier layer 26, which is a heat/solar shield is positioned on a top surface 30 of the insulation support or forms the top surface of the insulation support by being co-molded with or applied to the insulation support. The insulation layer 16 is positioned on the insulation support and the cap 18 is positioned such that the insulation layer is below a bottom surface of the cap such that an air gap is created to enhance IR reflectivity. The cap 18 also has a plurality of legs 32 positioned around the perimeter of the cap extending downwardly which rests on the pads 28. The combination of the insulation 16 and the barrier layer provide electromagnetic radiation reflection away from protected components within the cover 12 and electromagnetic radiation absorption between the heat source and the components being shielded within the cover 12. These components also provide enhanced insulation to reduce heat transfer rates to the protected components. The insulation support and the barrier layer 26 allow for natural convection from the pedestal housing.

Figure 3:
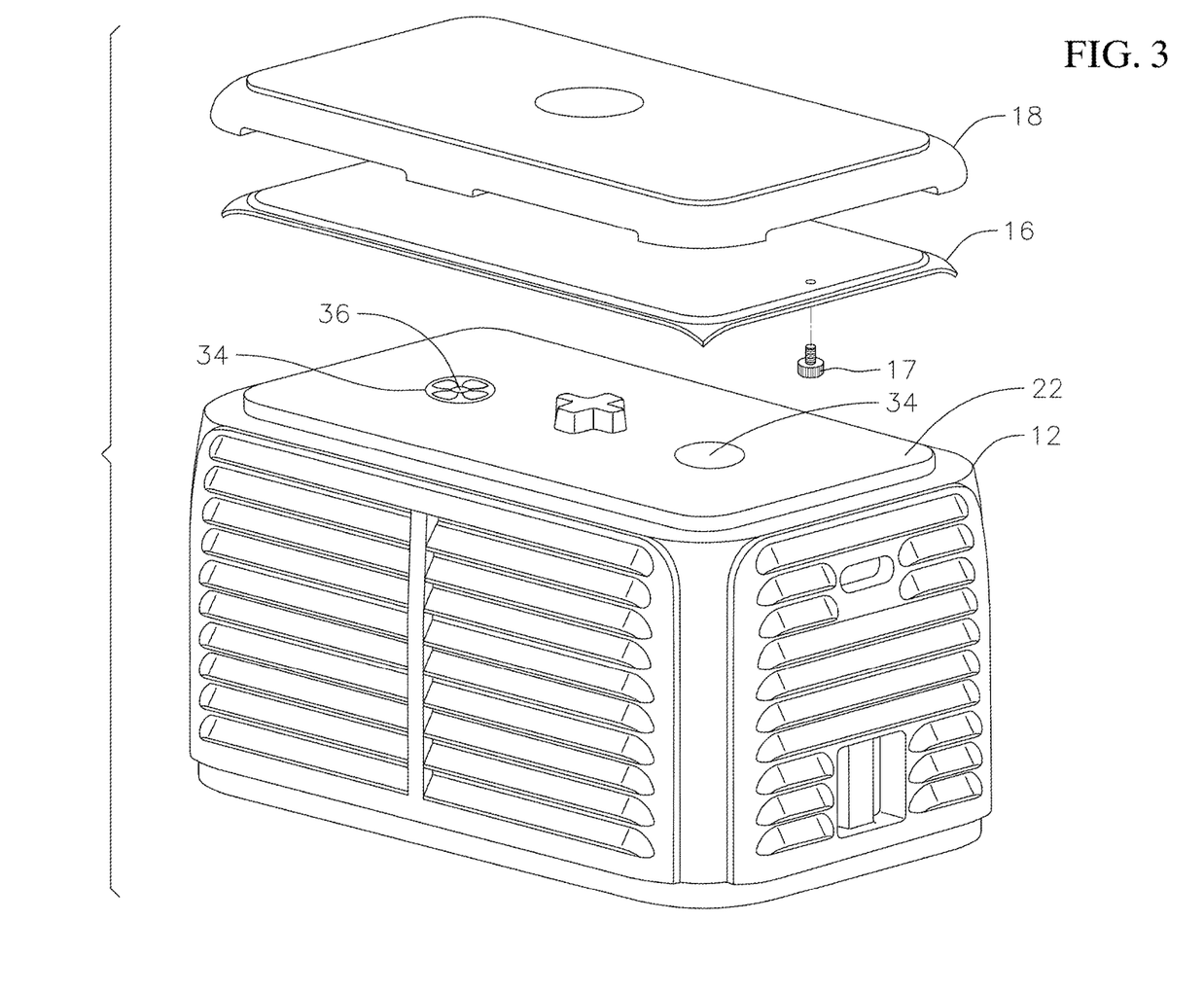
FIG. 3 is a an exploded view of an alternative embodiment pedestal housing of the present invention.
Figure 4:
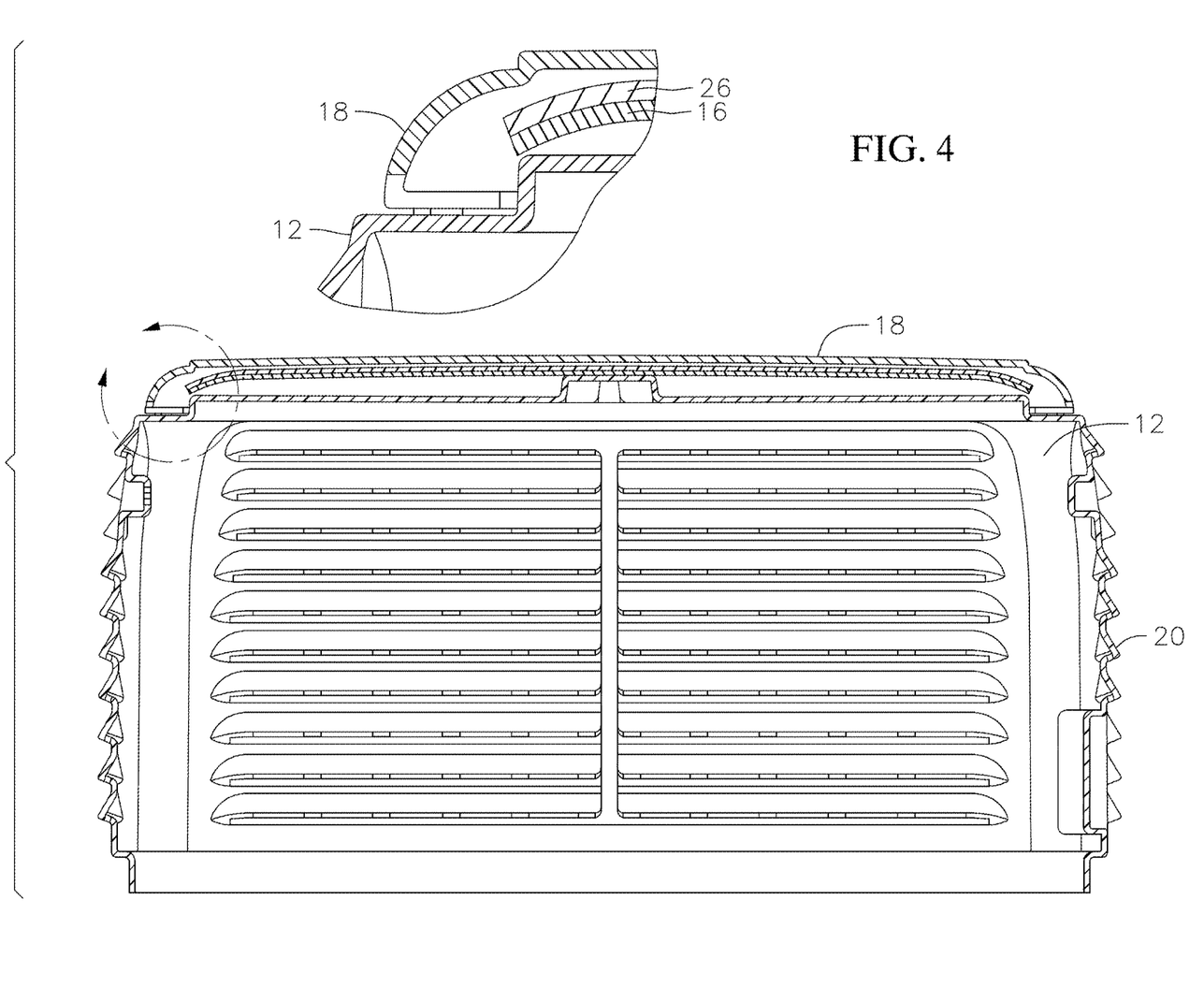
FIG. 4 is a cross-sectional view of the pedestal housing of FIG. 3.
Figure 5:
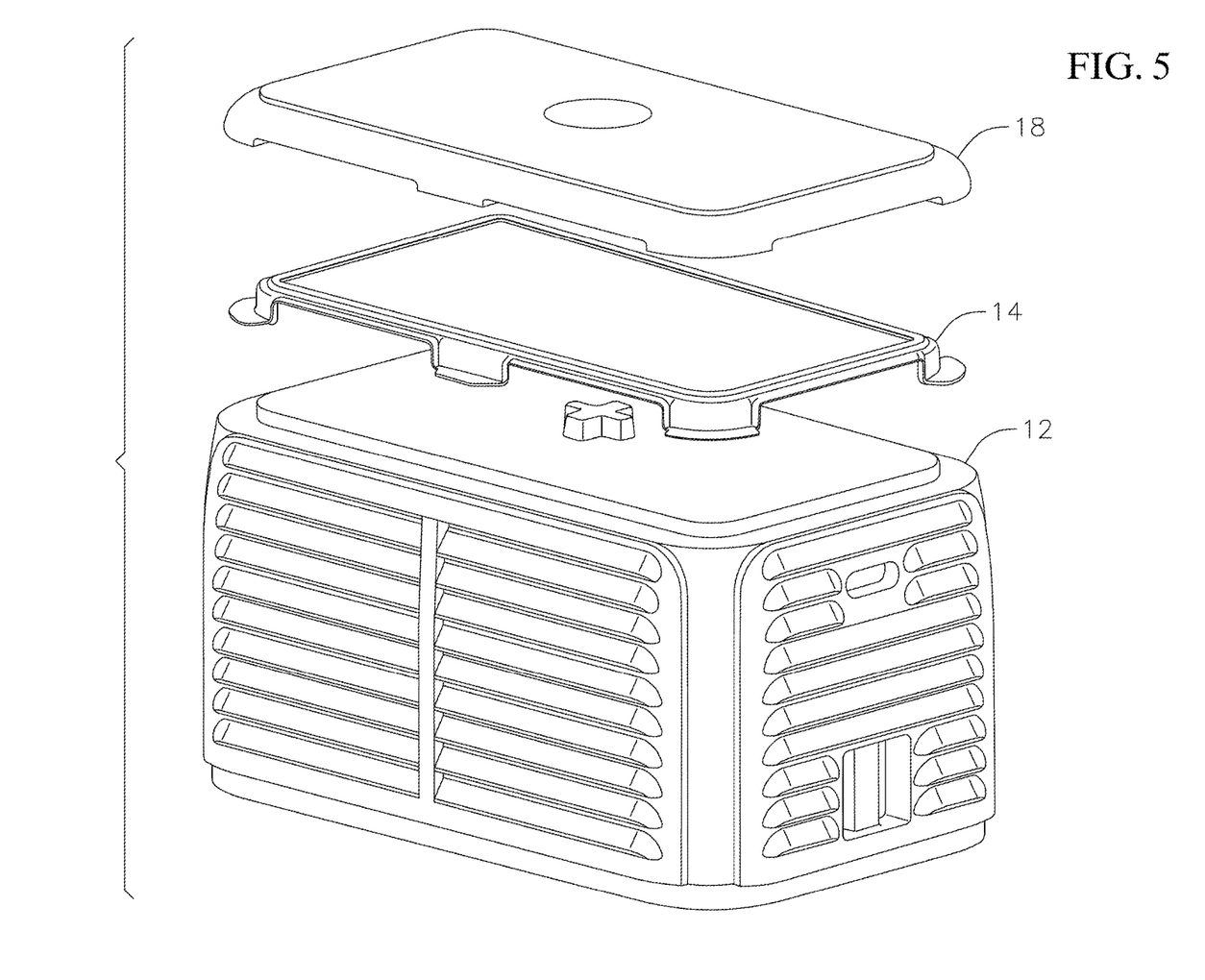
FIG. 5 is an exploded perspective view of another alternative embodiment pedestal housing of the present invention.
Figure 6:
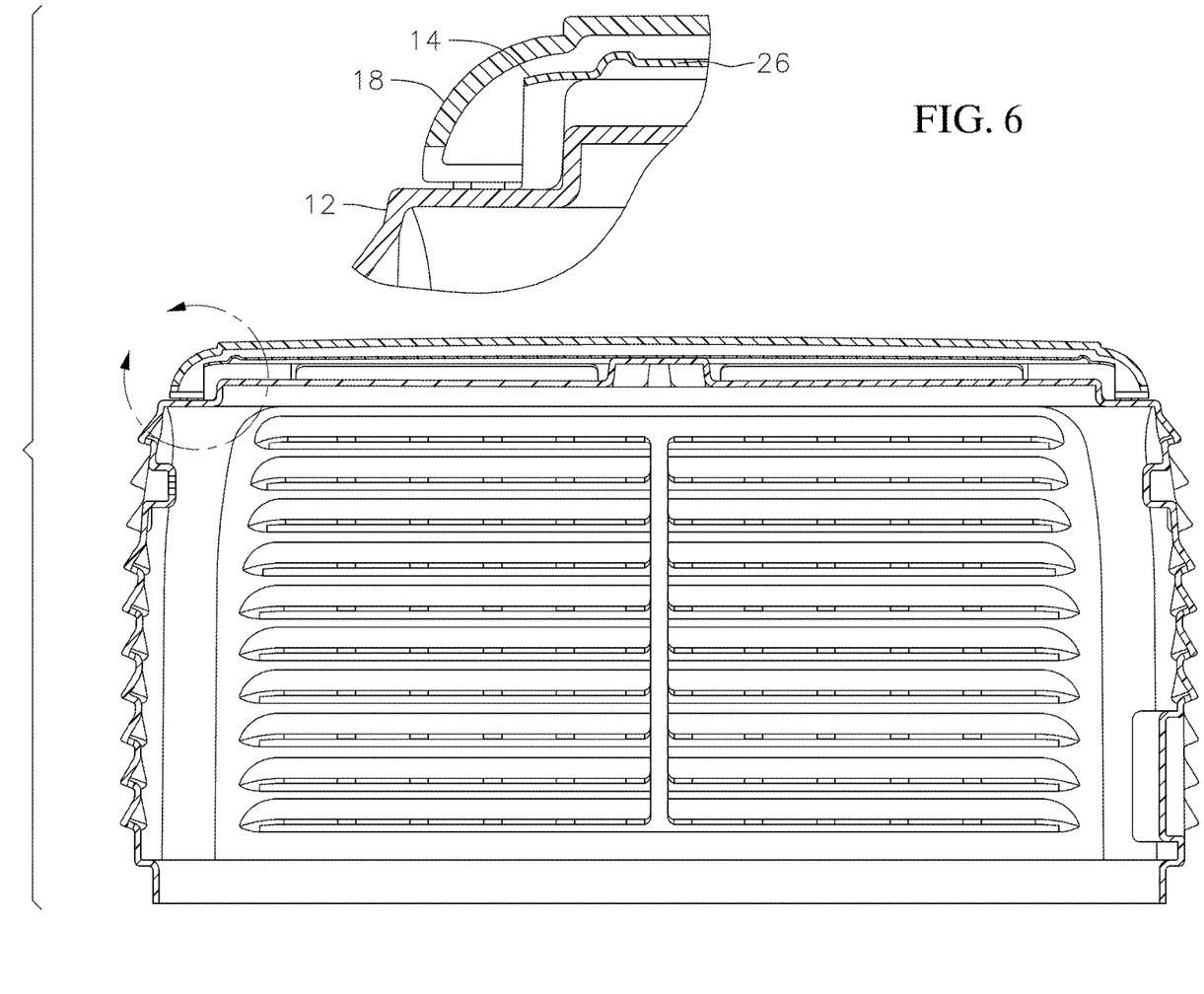
FIG. 6 is a cross-sectional view of the pedestal housing of FIG. 5.

FIGS. 3 and 4 illustrate an embodiment where there is no insulation support layer and insulation layer 16 is attached to the underside of cap 18 typically by spin weld, spin nut 17 or other mechanical fasteners. Barrier layer 26 is attached to the upper surface of insulation layer 16. FIGS. 5 and 6 illustrate an embodiment wherein no insulation layer is provided and comprises a cover 12, an insulation support 14 and a cap 18. As seen in FIG. 6, the insulation support 14 can have a barrier layer 26. The barrier layer 26 on the insulation support can be a separate layer applied to the insulation support or can be integral with the insulation support by being co-molded together. As shown in FIG. 3, the top surface 22 of the cover for any of the embodiments can have vent holes 34 for airflow or the insertion of fans 36 as required for a particular application.

Methods of manufacture for the pedestal housing of the present invention can include injection molding, blow molding, rotational molding, vacuum molding, and other non-commercially available methods. The present invention is designed for thermal management to be optimized using electromagnetic reflection, absorption and insulation as well as airflow management. The pedestal housing also results in reduced EMR transmission. Infrared radiation reflective material can be added to plastic pigments during the manufacturing process. As shown in the heat dissipation testing chart below, temperature within the pedestal housing is significantly reduced by the construction of the present invention.

TABLE I

Heat Dissipation Testing

| Sample | 1 in Node (° C.) | 2 Top Rear (° C.) | 3 Top Front (° C.) | 4 Back Low (° C.) | 5 Bottom (° C.) | 6 Back High (° C.) | 7 Dark Side Rear (° C.) | 8 Bottom (° C.) | 9 Lit Side Rear (° C.) | 10 Front Low (° C.) | 11 Front High (° C.) | 12 Lit Side Front (° C.) | 13 Dark Side Front (° C.) | Room (° C.) |
|---|---|---|---|---|---|---|---|---|---|---|---|---|---|---|
| Control | 77.64 | 59.98 | 60.5 | 57.25 | 51.83 | 57.71 | 51.13 | 52.41 | 54.09 | 49.52 | 49.81 | 52.46 | 50.92 | 42.78 |
| Control Insulation | 75.45 | 56.81 | 57.9 | 55.37 | 50.5 | 55.58 | 50.41 | 51.14 | 52.99 | 48.95 | 47.62 | 49.93 | 49.54 | 42.44 |
| Supervented | 75.88 | 58.42 | 59.58 | 56.01 | 50.67 | 56.48 | 50.08 | 51.01 | 52.89 | 49.06 | 48.43 | 50.84 | 49.65 | 42.39 |
| Vac No Insulation | 75.7 | 57.43 | 58.18 | 55.99 | 50.45 | 55.97 | 49.77 | 50.69 | 52.46 | 48.88 | 47.09 | 51.08 | 49.5 | 42.32 |
| Vac with Insulation | 75.99 | 57.25 | 57.97 | 55.75 | 50.57 | 56.08 | 49.93 | 51.01 | 52.45 | 49.07 | 47.64 | 50.81 | 49.7 | 42.58 |
| Chrome | 75.58 | 56.75 | 57.8 | 55.53 | 50.36 | 55.66 | 49.88 | 50.76 | 52.54 | 48.71 | 47.21 | 50.79 | 49.4 | 42.13 |

TABLE I-continued

Heat Dissipation Testing

| Sample | 1 in Node (° C.) | 2 Top Rear (° C.) | 3 Top Front (° C.) | 4 Back Low (° C.) | 5 Bottom (° C.) | 6 Back High (° C.) | 7 Dark Side Rear (° C.) | 8 Bottom (° C.) | 9 Lit Side Rear (° C.) | 10 Front Low (° C.) | 11 Front High (° C.) | 12 Lit Side Front (° C.) | 13 Dark Side Front (° C.) | Room (° C.) |
|---|---|---|---|---|---|---|---|---|---|---|---|---|---|---|
| Chrome with Insulation | 75.45 | 56.8 | 57.9 | 55.37 | 50.5 | 55.57 | 50.41 | 51.14 | 53 | 48.95 | 47.63 | 49.94 | 49.53 | 42.41 |
| Spin Weld | 75.17 | 57.02 | 58.2 | 55.26 | 50.49 | 55.55 | 50.27 | 51.14 | 52.99 | 48.87 | 47.65 | 50.38 | 49.64 | 42.2 |
| 2442 | 73.57 | 55.89 | 55.6 | 53.27 | 48.96 | 54.41 | 49.16 | 49.44 | 48.8 | 50.88 | 51.1 | 49.09 | 48.36 | 42.16 |
| 2442 Spin Weld | 73.15 | 55.51 | 54.56 | 52.76 | 49.02 | 54.48 | 49.23 | 48.62 | 48.18 | 50.71 | 51.63 | 49.14 | 46.76 | 42.22 |

While the present invention has been described and illustrated by various embodiments thereof, it is to be understood that changes and modifications can be made therein which are within the intended scope of the invention as hereinafter claimed.

What is claimed is:

1. A pedestal housing configured for heat reduction within the pedestal housing for electronic components contained within the pedestal housing comprising:
    a cover having side walls and an integrally formed upper surface with the side walls, the upper surface enclosing the side walls;
    a cap positioned on the upper surface of the cover forming an attic above the cover;
    said cover and cap being subject to direct solar and radiant heat exposure;
    a support layer and an insulation layer positioned between the cover and the cap,
    the support layer having a plurality of legs which engage the upper surface of the cover to create an airgap between the support layer and the cover;
    the cap having a plurality of legs, wherein each leg of the cap contacts an upper layer and the cap; and
    a heat and solar barrier layer positioned within the attic.

2. The pedestal housing of claim 1 wherein the insulation layer is positioned on the support layer adjacent the cap.

3. The pedestal housing of claim 1 wherein the heat and solar barrier layer is positioned on the support layer.

4. The pedestal housing of claim 1 wherein the heat and solar barrier layer is co-molded with or applied to the support layer.

5. The pedestal housing of claim 1 wherein the heat and solar barrier layer is attached to the insulation layer.

6. The pedestal housing of claim 1 wherein the cover has at least one vent hole in an upper surface for ventilation.

7. The pedestal housing of claim 1 wherein the cover has a plurality of vents positioned around sides of the cover.

8. The pedestal housing of claim 6 wherein a fan is positioned in the vent hole.

9. The pedestal housing of claim 1 wherein the heat and solar barrier layer is a heat reflective material.

10. The pedestal housing of claim 1 wherein the heat and solar barrier layer is a heat absorption material.

11. The pedestal housing of claim 1 wherein the heat and solar barrier layer is an infrared reflective material comprising at least one of a transition metal, inorganic or organic material.

12. A pedestal housing for electronic components comprising:
    a housing component for receipt of the electronic components;
    the housing component having side walls and an integrally formed top portion with the side walls enclosing the electronic components within the pedestal housing;
    an attic component positioned above the housing component having a plurality of legs that supports the attic component above the top portion of the housing component;
    a support layer positioned between the attic component and the housing component having a plurality of legs that engage the top portion of the housing component and creates an airgap between the support layer and the top portion of the housing component;
    wherein each leg of the attic component contacts an upper surface of one leg of the support layer to create an second airgap between the support layer and the attic component; and
    a barrier layer positioned within the attic component for electromagnetic radiation reflection away from the electronic components or electromagnetic radiation absorption between a radiation source and the electronic components.

13. The pedestal housing of claim 12 further comprising an insulation layer in the attic component.

14. The pedestal housing of claim 13 wherein the barrier layer is positioned on the support layer.

15. The pedestal housing of claim 13 wherein the barrier layer and the support layer are co-molded.

16. The pedestal housing of claim 13 wherein the barrier layer is attached to the insulation layer.

17. The pedestal housing of claim 12 wherein the barrier layer is an infrared reflective material comprising at least one of a transition metal, inorganic or organic material.

* * * * *

UNITED STATES PATENT AND TRADEMARK OFFICE
CERTIFICATE OF CORRECTION

PATENT NO. : 10,757,836 B2
APPLICATION NO. : 16/191046
DATED : August 25, 2020
INVENTOR(S) : Michael A. Lemacks et al.

It is certified that error appears in the above-identified patent and that said Letters Patent is hereby corrected as shown below:

In the Claims

Column 5, Line 36, Claim 1    after "upper" insert -- surface of one leg of the support layer to create a second airgap between the support --

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*